United States Patent [19]

Uhlig

[11] 4,301,234

[45] Nov. 17, 1981

[54] PROCESS FOR THE PREPARATION OF RELIEF-TYPE RECORDINGS USING DIAZONIUM CONDENSATION PRODUCT AND AMINE RESIN AS LIGHT-SENSITIVE RECORDING LAYER AND INCOHERENT RADIATION SOURCE FOR RECORDING IMAGE

[75] Inventor: Fritz Uhlig, Wiesbaden, Fed. Rep. of Germany

[73] Assignee: Hoechst Aktiengesellschaft, Fed. Rep. of Germany

[21] Appl. No.: 182,388

[22] Filed: Aug. 29, 1980

Related U.S. Application Data

[63] Continuation of Ser. No. 41,812, May 23, 1979, abandoned.

[30] Foreign Application Priority Data

May 26, 1978 [DE] Fed. Rep. of Germany ....... 2822887

[51] Int. Cl.³ .......................... G03C 5/08; G03F 7/08
[52] U.S. Cl. ................................... 430/325; 430/175; 430/176; 430/300; 430/302; 430/292; 430/306; 430/307; 430/308; 430/310; 430/311
[58] Field of Search .............. 430/175, 176, 325, 302, 430/300, 292, 306, 307, 308, 310, 311

[56] References Cited

U.S. PATENT DOCUMENTS

| | | | |
|---|---|---|---|
| 3,396,019 | 8/1968 | Uhlig | 430/175 |
| 3,396,020 | 8/1968 | Borchers | 430/175 |
| 3,679,419 | 7/1972 | Gillich | 430/175 |
| 3,790,385 | 2/1974 | Steppan et al. | 430/175 |
| 3,849,392 | 11/1974 | Steppan et al. | 430/302 |
| 3,867,147 | 2/1975 | Teuscher | 430/175 |
| 4,063,949 | 12/1977 | Uhlig et al. | 430/300 |
| 4,144,067 | 3/1979 | Ruckert et al. | 430/175 |

FOREIGN PATENT DOCUMENTS 1522503 9/1969 Fed. Rep. of Germany.

*Primary Examiner*—Charles L. Bowers, Jr.
*Attorney, Agent, or Firm*—James E. Bryan

[57] ABSTRACT

This invention relates to an improvement in a light-sensitive recording material comprising a support and a light-sensitive layer including a diazonium salt polycondensation product composed of recurrent units of the general types $(A-N_2X)$ and $(B)$ which are connected with each other by bivalent intermediate members derived from a condensable carbonyl compound and wherein A is the radical of a diazonium salt which comprises at least two isocyclic or heterocyclic aromatic rings and which in at least one position of its molecule is capable of condensation with formaldehyde in an acid medium, B is the radical of a compound free of diazonium groups which in at least one position of its molecule is capable of condensation with formaldehyde in an acid medium, and X is the anion of the diazonium salt, the improvement that the light-sensitive layer additionally contains about 6 to 20 parts by weight of amine resin per part by weight of the polycondensation product.

5 Claims, No Drawings

PROCESS FOR THE PREPARATION OF RELIEF-TYPE RECORDINGS USING DIAZONIUM CONDENSATION PRODUCT AND AMINE RESIN AS LIGHT-SENSITIVE RECORDING LAYER AND INCOHERENT RADIATION SOURCE FOR RECORDING IMAGE

This is a continuation, of application Ser. No. 041,812, filed May 23, 1979, now abandoned.

The present invention relates to a light-sensitive recording material with a light-sensitive layer comprising a diazonium salt polycondensation product and an amine resin. Further, the invention relates to a process for the preparation of relief-type recordings by exposure of the material with incoherent actinic light and development.

German Pat. No. 1,447,952, discloses a presensitized printing plate which comprises, in its light-sensitive layer, a condensation product of a diazonium salt and formaldehyde, and an amine resin. The light-sensitivity of this material is not particularly good. The patent does not indicate that it is influenced by the presence of the amine resin.

Similar recording materials are known from German Offenlegungsschrift No. 2,024,244, which contain, as light-sensitive substances, polycondensation products of condensable diazonium salts and condensable, non-light-sensitive second components. These condensation products impart a higher light-sensitivity to the material. In addition thereto, the light-sensitive layer may contain further components, such as amine resins and dyes, e.g. triphenylmethane dyes. As far as can be seen from the Offenlegungsschrift, the light-sensitivity of the material is not influenced by these additives of which normally smaller quantities are present than of the diazonium salt polycondensation products.

In the earlier German patent application No. P 27 28 947, a process for the manufacture of planographic printing forms is disclosed in which a printing plate comprising a support of anodized aluminum, the oxide layer of which weighs at least 3 g/m², and a light-sensitive layer containing a negative-working diazo compound, e.g. a diazonium salt polycondensation product, and an amine resin, is irradiated with imagewise controlled laser beams. By the addition of the amine resin, at a rate from 0.1 to 10 parts by weight per part by weight of the diazo compound, the sensitivity of the material to laser beams and the printing runs of the resulting printing form are increased.

It is the object of the present invention to provide a negative working light-sensitive recording material based on light-sensitive diazo compounds, which is distinguished by a particularly high light-sensitivity when it is exposed to the actinic light of conventional copying lamps, i.e. incoherent light.

The invention is based on a light-sensitive recording material which contains in its light-sensitive layer an amine resin and a diazonium salt polycondensation product composed of recurrent units of the general types (A—N$_2$X) and (B)

which are connected with each other by bivalent intermediate members derived from a condensable carbonyl compound and wherein:

A is the radical of a diazonium salt which comprises at least two isocyclic or heterocyclic aromatic rings and which in at least one position of its molecule is capable of condensation with formaldehyde in an acid medium, B is the radical of a compound free of diazonium groups, which in at least one position of its molecule is capable of condensation with formaldehyde in an acid medium, and X is the anion of the diazonium salt.

In the recording material according to the present invention, the light-sensitive layer contains from 6 to 20, preferably between 7 and 15 parts by weight of amine resin per part by weight of the diazonium salt polycondensation product.

The diazonium salt polycondensation products used according to the present invention are known and have been disclosed in detail, e.g., in German Offenlegungsschrift No. 2,024,244, and in U.S. Pat. No. 3,867,147. Among the condensation products, those are preferred in which the units B are radicals of aromatic amines, phenols, thiophenols, phenol ethers, aromatic thioethers, aromatic hydrocarbons, aromatic heterocyclic compounds, or organic acid amides produced by condensation.

Preferably, the units A—N$_2$X are derived from compounds corresponding to the following formula (R$_1$—R$_3$)$_p$R$_2$—N$_2$X wherein:

X is the anion of the diazonium salt, p is a whole number from 1 to 3,

R$_1$ is an aromatic group with at least one position capable of condensation,

R$_2$ is a phenylene group which is either unsubstituted or substituted by halogen atoms, or carboxyl, sulfonyl, alkyl or alkoxy groups, R$_3$ is either a single bond or one of the following groups —(CH$_2$)$_q$—NR$_4$—

—O—(CH$_2$)$_r$—NR$_4$—

—S—(CH$_2$)$_r$—NR$_4$—

—S—CH$_2$CO—NR$_4$—

—O—

R$_5$—O—

—O—

—S— or

—CO—NR$_4$— wherein:

q is a whole number from 0 to 5, r is a whole number from 2 to 5,

R$_4$ is hydrogen, an alkyl group with 1 to 5 carbon atoms, an aralkyl group with 7 to 12 carbon atoms, or an aryl group with 6 to 12 carbon atoms, and R$_5$ is an arylene group with 6 to 12 carbon atoms.

Further, the present invention relates to a process for the preparation of relief-type recordings, wherein the above-described recording material is imagewise exposed to incoherent actinic light, either in contact with or by projection through a master, and the unexposed areas of the layer are then removed by washing with a developer.

By adding amine resins in the quantities stated to the light-sensitive layer, the light-sensitivity of the layer is increased to many times that of a corresponding layer containing no amine resin. This result is particularly surprising because no substantial increase of the light-sensitivity was observed when adding amine resins to recording layers containing diazonium salt/formaldehyde condensation products (German Pat. No. 1,447,952). The increased sensitivity to laser beams produced according to our earlier German patent application No. P 27 28 947 by the addition of amine resins is also far from the increase achieved by the present invention, apart from the fact that in our earlier application it is restricted to the use of aluminum supports carrying oxide layers of a certain thickness.

The light-sensitivity of the recording layers according to the present invention may be further increased by adding dyes in the quantities stated hereinafter, and optimum effects may be achieved by combining the two additives.

The metal halide lamps conventionally used in the reproduction field, which may have power inputs of up to several thousand watts, are preferred as light sources for the imagewise exposure of the layers according to the present invention. When such lamps are used, exposure times of a few seconds are achieved for layer thicknesses of the order of 1 $\mu$m, as are normal for planographic printing plates. Alternatively, it is also possible to use known xenon lamps, carbon arc lamps, flat-lighting pneumatic lamps comprising luminescent tubes, or projection lamps, provided they emit sufficiently intensively within the near ultraviolet and/or short-wave visible range of the spectrum.

Amine/formaldehyde condensation resins obtained by condensation of formaldehyde with urea, urethanes (carbamic acid esters), aniline, or melamine, are preferably used as amine resins. Condensation products of this type are known and are commercially available in many variations. Suitable products are described, e.g. in "Kunststoff-Handbuch" (Plastics Handbook), Volume X, published by Vieweg and Becker, Carl Hanser Verlag, Munich (1968).

It may be of advantage to add dyes or pigments to the layers, e.g. triphenylmethane dyes, azo dyes, or pigments such as phthalocyanine, in the form of dispersions. Preferably, the ratio of diazo polycondensate to dye should be between 1:0.5 and 1:4 parts by weight.

Examples of suitable triphenyl methane dyes are: Crystal Violet (Color Index 42,555), Astrazon Orange, Brilliant Blue Salt SM (C.I. Solvent Blue 66), Patent Blue AE, Rhodamine, Victoria Pure Blue B conc. (C.I. 42,525), Victoria Pure Blue FGA (C.I. Basic Blue 81), Patent Blue V (C.I. 42,045), Eosin, Malachite Green (C.I. 42,000), Brilliant Green, Rosaniline, Methyl Violet (C.I. 42,535) Water Blue, Spirit Blue, Phenolphthalein, and Acetosol Green.

The recording material according to the present invention may be prepared and stored in the form of a presensitized material, or the coating mixture may be stored and shipped in the form of a solution or dispersion and applied by the consumer to an individual support, e.g. for the production of etch resists, and then dried, exposed, and developed. Alternatively, a support may be prepared by the manufacturer and then coated with the solution by the consumer, by the so-called "wipe-on" method, or the amine resin may be applied to the support by the manufacturer and the material then may be sensitized by the consumer by application of the diazonium salt polycondensation product, in which case a dye may be applied either together with the resin or with the diazonium salt polycondensation product, or with both.

Preferably, the recording material according to the invention is marketed in the form of a presensitized material for the photomechanical production of printing plates, especially planographic printing plates. Liquids known for their good dissolving power may be used as solvents for the manufacture of the material according to the present invention, e.g. alcohols, amides, and ketones; ethyleneglycol monomethyl ether, ethyleneglycol monoethyl ether, ethyleneglycol monoisopropylether, dimethyl formamide, diacetone alcohol, and butyrolactone are preferred. Frequently, ethers and esters, such as dioxane, tetrahydrofuran, butyl acetate, and ethyleneglycol methyl ether acetate, are added to these solvents to produce uniform layers. The light-sensitive mixture is dissolved in one or several of these solvents and applied to a support suitable for reprographic purposes, whereupon the applied layer is dried. The coating may be applied by whirler-coating, spraying, immersion, roller application, or with the aid of a liquid film.

Very different materials may be used as supports, e.g. paper, zinc, magnesium, aluminum, chromium, copper, brass, steel, and multimetal plates and plastic films. For the manufacture of planographic printing plates, mechanically, chemically, or electrochemically roughened and/or anodized aluminum plates are preferred, and prior to sensitization, the plates advantageously may be pretreated with phosphonic acids or phosphonic acid derivatives according to German Pat. Nos. 1,160,733 or 1,621,478, or with alkali silicates according to German Pat. No. 907,147, or with zirconium or titanium hexahalides according to German Auslegeschrift Nos. 1,183,919 or 1,192,666, or with monomeric or polymeric carboxylic acids or a benzophenone compound according to German Auslegeschrift No. 1,671,643.

In addition to the components already mentioned, the layers may contain various other resins in small proportions, i.e. up to about 20 percent by weight of the total quantity of resin present. Such resins are, e.g., phenol resins, unmodified epoxy resins, also those of higher molecular weight, oil-modified alkyd resins, polyamides, polyurethanes, polyvinyl resins, acrylic acid resins, polyvinyl acetates, polyvinyl chloride, polyesters, nitrocellulose, polyvinyl acetals, and others.

Furthermore, plasticizers, wetting agents and indicators may be added to the recording layers. All additives should be selected in a manner such that they are compatible with the other components of the layer and absorb as little as possible within the absorption range of the light-sensitive substance.

Presensitized planographic printing plates which carry only a thin layer according to the present invention, i.e. down to about 0.1 g/m$^2$, already possess excellent copying and printing properties, e.g. high light-sensitivity, ready developability combined with good resistance to the developer solution, excellent shelf life, and capability of printing long runs of copies with images of true tonal values. Normally, layer thicknesses between about 0.3 and 1.5 g/m$^2$ are preferred.

The recording materials according to the present invention, especially presensitized printing plates are processed in the normal manner until they are ready for printing. The material is exposed behind a master to light sources emitting within the ultraviolet range of the spectrum. While the layer is hardened and becomes insoluble in the areas affected by the light, the unexposed areas of the layer remain soluble and are removed by immersion of the material in a suitable developer and/or by manually or mechanically dabbing the material with the developer. The planographic printing plate thus produced may be inked with greasy ink after development and covered with a protective coating, e.g. a gm arabic layer.

Aqueous, weakly alkaline solutions are preferably used as developer solutions; they may contain up to 15 percent of their volume of organic solvents, e.g. lower molecular weight monohydric or polyhydric aliphatic alcohols, such as ethanol, propanols, glycerol, glycols, benzyl alcohol and the like. Generally, the solutions also contain wetting agents and salts.

The light-sensitive recording materials according to the present invention are preferably used for the preparation of planographic printing plates. Alternatively, they may be converted into letterpress printing forms, gravure printing forms or multi-metal printing forms by etching them after development. Further, it is possible to use them for the manufacture of printed circuits, of screen printing stencils, and the like. Recording layers of high photographic density, especially within the actinic range of the spectrum, also may be applied to transparent supports, preferably polyester films, and processed to form colored images which may be used as intermediate masters, e.g. as a substitute for lithographic silver halide films.

The following examples serve to illustrate preferred embodiments of the recording materials according to the present invention. Percentages are by weight unless otherwise stated. One part by weight is 1 g if 1 ml is one part by volume.

EXAMPLE 1

A 0.3 mm thick aluminum plate is mechanically roughened by brushing and then immersed for 30 seconds at 60° C. in a 0.3 percent by weight aqueous polyvinyl phosphonic acid solution and dried. The thus pretreated aluminum plate is then coated with a solution of the following composition:
- 0.2 p.b.w. of the diazonium salt polycondensate described below,
- 0.2 p.b.w. of phosphoric acid (85%),
- 4.33 p.b.w. of a highly reactive, unplasticized urea-formaldehyde resin as a 60% solution in isobutanol (dynamic viscosity of the solution approximately 2500 mPa·s (cP) at 20° C., acid number below 2),
- 0.52 p.b.w. of a nondrying alkyd resin as a 60% solution in xylene; dynamic viscosity of the solution 500 to 650 mPa·s at 20° C., acid number below 10,
- 0.30 p.b.w. of Methyl Violet (C.I. No. 42,535),
- 60.0 p.b.w. of ethyleneglycol monomethyl ether,
- 20.0 p.b.w. of tetrahydrofuran,
- 10.0 p.b.w. of dimethyl formamide, and
- 10.0 p.b.w. of butyl acetate.

The aluminum plate sensitized with this solution is then dried and exposed for 6 seconds under a photographic negative to produce a printing form, a 5 kW xenon lamp of a copying apparatus being used as the light source. The exposed layer is then developed with the following solution:
- 0.15 p.b.w. of sodium metasilicate ·9 $H_2O$
- 0.50 p.b.w. of sodium dodecyl hydrogen sulfate,
- 1.00 p.b.w. of benzyl alcohol, and
- 98.35 p.b.w. of water and inked up. Thereafter, the plate was ready for printing.

The diazo polycondensate is prepared by condensing 1 mole of 3-methoxy-diphenylamine-4-diazonium sulfate with 1 mole of 4,4'-bis-methoxymethyldiphenyl ether in 85% phosphoric acid at 40° C. The condensate is isolated in the form of the mesitylene sulfonate.

EXAMPLE 2

A wet-strength paper weighing 120 $g/m^2$ is coated on both surfaces with layers of 29 $g/m^2$ each composed of 100 parts by weight of clay and 20 parts by weight of casein, and the paper is then calendered. One surface of the precoated paper is then coated with an aqueous solution containing 1% of sodium alginate and 0.6% of ammonium bichromate in such a manner that a dry layer weighing 2.5 $g/m^2$ results.

The coated paper plate is then washed with a 2% aqueous dispersion of silica and dried.

The paper printing foil thus produced is then coated with the following solution:
- 0.20 p.b.w. of the diazonium salt polycondensate described in Example 1,
- 0.02 p.b.w. of phosphoric acid (85%),
- 2.60 p.b.w. of an unplasticized urea resin of relatively high viscosity, as a 65% solution in butanol (dynamic viscosity of the solution approximately 3650 mPa·s at 25° C., acid number below 3),
- 0.2 p.b.w. of Victoria Pure Blue BOC (C.I. 42,595), and
- 97.0 p.b.w. of ethyleneglycol monomethyl ether.

For the preparation of the printing form, the plate is exposed for 3 seconds and then developed by wiping with the developer mentioned in Example 1.

EXAMPLE 3

An aluminum plate is mechanically roughened by brushing, then immersed for 1 minute at 70° C. in a 20 percent trisodium phosphate solution, rinsed first with cold water, then with warm water, treated for 3 minutes with a 2 percent sodium silicate solution at 90° C. and finally briefly rinsed with water and dried.

The thus pretreated plate is coated with the following solution:
- 6.0 p.b.w. of an acid-hardenable, unplasticized urea resin as a 63% solution in ethanol (dynamic viscosity of the solution approximately 525 to 700 mPa·s at 20° C., acid number below 2), and
- 0.6 p.b.w. of Brilliant Blue Salt SM (C.I. Solvent Blue 66) and dried.

Prior to its use, the plate is sensitized, by means of a roller coater, with a 0.6 percent aqueous solution of the diazonium salt polycondensate described in Example 1, which for this Example is separated in the form of the methane sulfonate, and is then dried. After an exposure of 6 seconds under a film master, the plate is developed and simultaneously lacquered by applying the following emulsion:

Non-aqueous phase:
- 30 p.b.w. of ethyleneglycol methyl ether acetate,
- 40 p.b.w. of cyclohexanone,
- 25 p.b.w. of xylene,
- 25 p.b.w. of tetrahydro naphthalene,
- 50 p.b.w. of a cresol-formaldehyde novolak with a melting range of 108° to 118° C.,
- 5 p.b.w. of "Lithol Rubin B."

Aqueous phase:
  36 p.b.w. of gum arabic,
  340 p.b.w. of water, and
  2 p.b.w. of a wetting agent (fatty acid/hydroxy ethyl sulfonic acid condensation product).

EXAMPLE 4

An aluminum web which had been roughened by brushing with nylon brushes in a suspension of pumice grit is immersed for 30 seconds in a 1 percent solution of potassium hexafluoro zirconate at 70° C., rinsed with water, and dried. The web is then sensitized with the following solution:
  0.40 p.b.w. of a diazonium salt polycondensate prepared from 1 mole of 3-methoxy-diphenylamine-4-diazonium sulfate and 0.5 mole of bis-methoxymethyl-diphenyl ether in 86 percent phosphoric acid at 40° C., and precipitated as the naphthalene-2-sulfonate,
  0.08 p.b.w. of phosphroic acid (85%),
  8.20 p.b.w. of an unplasticized melamine resin as a 50% alcoholic solution (dynamic viscosity of the solution 300 to 600 mPa·s at 20° C., acid number below 1),
  0.82 p.b.w. of an epoxy resin obtained from bisphenol A and epichlorohydrin, with a melting point of 70° C., an epoxy equivalent weight of 459, a hydroxyl value about 0.3, and a molecular weight below 1,000,
  0.30 p.b.w. of Crystal Violet Base (C.I. 42,555).

For the preparation of the printing form, the aluminum web is exposed for 5 seconds under a 5 kW metal halide lamp and developed with the following solution:
  0.3 p.b.w. of sodium metasilicate·9 H$_2$O
  2.0 p.b.w. of sodium lauryl sulfate,
  4.0 p.b.w. of benzyl alcohol, and
  93.5 p.b.w. of water.

EXAMPLE 5

An aluminum web provided with an anodic oxide layer weighing 2.5 g/m$^2$ and pretreated with polyvinyl phosphonic acid is sensitized by applying the following solution:
  0.40 p.b.w. of the diazonium salt polycondensate used in Example 1,
  0.04 p.b.w. of phosphoric acid (85%),
  4.80 p.b.w. of an unplasticized urea resin of medium viscosity as a 65% solution in butanol (dynamic viscosity of the commercial product 3000 to 3600 mPa·s at 20° C., acid number below 2)
  0.40 p.b.w. of Victoria Pure Blue FGA (C.I. Basic Blue 81),
  76.0 p.b.w. of ethyleneglycol monomethyl ether,
  17.0 p.b.w. of tetrahydrofuran, and
  4.4 p.b.w. of butyl acetate.

The aluminum web sensitized with this solution is cut into sections. For the preparation of printing forms, the material is exposed for 3 seconds under a master with a 5 kW metal halide lamp and developed with a solution of the following composition:
  0.2 p.b.w. of sodium metasilicate·9 H$_2$O,
  0.5 p.b.w. of sodium sulfate·10 H$_2$O,
  0.8 p.b.w. of an anion-active wetting agent, viz. ammonium alkyl polyoxy ethylene sulfate (alkyl group approximately 18 carbon atoms),
  2.0 p.b.w. of benzyl alcohol, and
  96.5 p.b.w. of water.
Similar results are obtained if 0.48 p.b.w. of an acrylic acid resin capable of crosslinking amine resins (dynamic viscosity of 340–650 mPa·s at 20° C., acid number—according to DIN 53183—of 60 to 90)
or the same quantity (0.48 p.b.w.) of an unplasticized, highly reactive melamine resin as a 55% solution in isobutanol (dynamic viscosity of the commercial product 380–500 cP at 20° C., acid number below 1) is added to the solution.

EXAMPLE 6

An aluminum web pretreated as described in Example 5 and provided with an anodic oxide layer weighing 1 g/m$^2$ is sensitized by applying the following solution:
  0.4 p.b.w. of the diazonium salt polycondensate used in Example 4,
  0.1 p.b.w. of phosphoric acid (85%),
  6.0 p.b.w. of an urea resin as a 65% solution in isobutanol (dynamic viscosity of the commercial product 1800 to 2100 mPa·s, acid number below 3),
  1.0 p.b.w. of a non-drying, modified alkyd resin based on branched fatty acids, as a 60% solution in xylene (viscosity of the commercial product 2.5 to 4.5 mPa·s, acid number 5 to 10), and
  1.6 p.b.w. of Patent Blue V (C.I. 42,045).
The web is cut into printing plates.

For the preparation of a printing form, the printing plate is exposed for 8 seconds in a microfilm-re-enlargement apparatus with a 1 kW mercury high-pressure lamp, which is adjusted to a 6-times linear enlargement by an appropriate lens, and is then developed with the following solution:
  0.3 p.b.w. of sodium metasilicate·9 H$_2$O,
  0.1 p.b.w. of trisodium phosphate,
  2.0 p.b.w. of sodium lauryl sulfate,
  4.0 p.b.w. of benzyl alcohol, and
  93.5 p.b.w. of water.

EXAMPLE 7

An aluminum web pretreated as described in Example 5 and provided with an anodic oxide layer weighing 3.2 g/m$^2$ is sensitized with the following solution:
  0.20 p.b.w. of the diazonium salt polycondensate used in Example 1,
  0.04 p.b.w. of phosphoric acid (85%),
  4.0 p.b.w. of an unplasticized, highly reactive urea resin of relatively low viscosity, as a 60 percent solution in isobutanol (dynamic viscosity of the commercial product 500–800 mPa·s, acid number below 3).

The aluminum web is then cut into suitable sections. For the preparation of a printing form, the printing plate is exposed for 2 seconds under a 5 kW metal halide lamp and developed with the following solution:
  0.5 p.b.w. of the sodium salt of diisobutyl naphthalene sulfonic acid,
  1.5 p.b.w. of benzyl alcohol, and
  98.0 p.b.w. of deionized water.

EXAMPLE 8

An aluminum web manufactured as described in Example 5 is coated with the following solution:
  0.40 p.b.w. of the diazonium salt polycondensate used in Example 1,
  0.04 p.b.w. of phosphoric acid (85%),
  6.00 p.b.w. of the urea resin used in Example 5,
  4.00 p.b.w. of a dispersion containing 10 p.b.w. of a blue phthalocyanine pigment (C.I. 74,160), and 10 p.b.w. of polyvinyl acetal in 80 p.b.w. of ethyleneglycol methyl ether acetate, and 90.00 p.b.w. of ethyleneglycol monomethyl ether.

For the preparation of a printing form, the material is exposed for 3 seconds under a metal halide lamp and then developed with the following solution:

0.2 p.b.w. of sodium metasilicate·9 $H_2O$, 0.5 p.b.w. of sodium sulfate·10 $H_2O$, 0.2 p.b.w. of the wetting agent used in Example 5, 10.0 p.b.w. of n-propanol, and 89.1 p.b.w. of water.

It will be obvious to those skilled in the art that many modifications may be made within the scope of the present invention without departing from the spirit thereof, and the invention includes all such modifications.

What is claimed is:

1. In the process for the preparation of relief-type recordings which comprises exposing, under a master, a light-sensitive layer of a recording material comprising a support and a light-sensitive layer thereon to an incoherent actinic light source which emits sufficiently intensively within the near ultraviolet and/or short-wave visible range of the spectrum, and removing the unexposed areas of the light-sensitive layer by washing with a developer, said light-sensitive layer consisting of a diazonium salt polycondensation product composed of recurrent units of the general types $(A—N_2X)$ and $(B)$ which are connected with each other by bivalent intermediate members derived from a condensable carbonyl compound and wherein:

A is the radical of a diazonium salt which comprises at least two isocyclic or heterocyclic aromatic rings and which in at least one position of its molecule is capable of condensation with formaldehyde in an acid medium, B is the radical of a compound free of diazonium groups which in at least one position of its molecule is capable of condensation with formaldehyde in an acid medium, and X is the anion of the diazonium salt the improvement that the light-sensitive layer additionally contains about 7 to 15 parts by weight of amine resin per part by weight of the polycondensation product, said amine resin being a condensation product of formaldehyde with urea, a urethane, aniline, or melamine, and about 0 to 20 percent by weight of the total quantity of resin present, of at least one resin selected from the group consisting of phenol resins, unmodified epoxy resins, oil-modified alkyl resins, polyamides, polyurethanes, polyvinyl resins, acrylic acid resins, polyvinyl acetates, polyvinyl chloride, polyesters, nitrocellulose and polyvinyl acetals, and exposing said light-sensitive layer to said incoherent actinic light source for a few seconds for 1 $\mu m$ of layer thickness.

2. A process according to claim 1 wherein in said product

B is a radical of an aromatic amine, of a phenol, a thiophenol, a phenol ether, an aromatic thioether, an aromatic hydrocarbon, an aromatic heterocyclic compound, or an organic acid amide.

3. A process according to claim 1 wherein in said product

A is the radical of a compound corresponding to the following formula $(R_1—R_3—)_pR_2—N_2X$ wherein X is the anion of the diazonium salt, p is a whole number from 1 to 3, $R_1$ is an aromatic group with at least one condensable position, $R_2$ is a phenylene group which may be substituted or unsubstituted by halogen atoms, carboxyl groups, sulfonyl groups, alkyl groups or alkoxy groups, $R_3$ is a single bond or one of the following groups $—(CH_2)_q—NR_4—$ $—O—(CH_2)_r—NR_4—$ $—S—(CH_2)_r—NR_4—$ $—S—CH_2CO—NR_4—$ $—O—R_5—O—$ $—O—$ $—S—$ or $—CO—NR_4—$ q is a whole number from 0 to 5, r is a whole number from 2 to 5, $R_4$ is hydrogen, or an alkyl group with 1 to 5 carbon atoms, an aralkyl group with 7 to 12 carbon atoms, or an aryl group with 6 to 12 carbon atoms, and $R_5$ is an arylene group with 6 to 12 carbon atoms.

4. A process according to claim 1 wherein said light-sensitive layer additionally contains a dye.

5. A process according to claim 4 in which the dye used is a triphenyl methane dye.

* * * * *